US008613861B2

(12) United States Patent
Chen et al.

(10) Patent No.: US 8,613,861 B2
(45) Date of Patent: Dec. 24, 2013

(54) METHOD OF MANUFACTURING VERTICAL TRANSISTORS

(75) Inventors: Hsiao-chia Chen, Taichung (TW); Sheng-chang Liang, Taichung (TW); Chien-hua Tsai, Taichung (TW); Masahiko Ohuchi, Taichung (TW)

(73) Assignee: Rexchip Electronics Corporation, Taichung (TW)

( * ) Notice: Subject to any disclaimer, the term of this patent is extended or adjusted under 35 U.S.C. 154(b) by 90 days.

(21) Appl. No.: 13/313,566

(22) Filed: Dec. 7, 2011

(65) Prior Publication Data

US 2013/0146561 A1 Jun. 13, 2013

(51) Int. Cl.
*H01B 13/00* (2006.01)

(52) U.S. Cl.
USPC ............... 216/13; 216/37; 216/67; 257/302; 257/328; 257/329; 438/212; 438/268

(58) Field of Classification Search
USPC ......... 216/37, 67, 13; 438/212, 268; 257/302, 257/328
See application file for complete search history.

(56) References Cited

U.S. PATENT DOCUMENTS

| 5,324,673 A * | 6/1994 | Fitch et al. ............... 438/156 |
| 7,217,628 B2 * | 5/2007 | Sheridan et al. ........... 438/322 |
| 7,898,014 B2 * | 3/2011 | Cheng et al. .............. 257/302 |

* cited by examiner

*Primary Examiner* — Nadine Norton
*Assistant Examiner* — Maki Angadi
(74) *Attorney, Agent, or Firm* — Muncy, Geissler, Olds & Lowe, PLLC

(57) ABSTRACT

A method of manufacturing vertical transistors includes steps of: forming a conductive layer on the surface of a substrate with a ditch and two support portions; removing the conductive layer on the bottom wall of the ditch and top walls of the support portions via anisotropic etching through a etch back process; forming an oxidized portion in the ditch; and etching the conductive layer to form two gates without contacting each other. By forming the conductive layer on the surface of the ditch and adopting selective etching of the etch back process, the problem of forming sub-trenches caused by lateral etching or uneven etching rate that might otherwise occur in the conventional etching process is prevented, and the risk of damaging metal wires caused by increasing etching duration also can be averted.

6 Claims, 16 Drawing Sheets

METHOD OF MANUFACTURING VERTICAL TRANSISTORS

FIELD OF THE INVENTION

The present invention relates to a semiconductor manufacturing method and particularly to a method of manufacturing vertical transistors.

BACKGROUND OF THE INVENTION

Constant advances of semiconductor manufacturing technology have greatly shrunken the size of electronic elements but greatly improve their performances. Conventional semiconductor manufacturing processes mainly focus on shrinking the size of transistors to increase circuit density of elements so that element size can be reduced to improve switching speed and power consumption, thereby to enhance the functionality of the elements. Shrinking the element size must be incorporated with precisely controlled etching process and equipments to make improving production yield possible. Please refer to FIGS. 1A through 1D for a conventional technique with a substrate 1 pending to be etched as an example for discussion. The substrate 1 mainly is made of silicon and etched to form trenches filled with insulated material. A first trench 2 on the right side is filled with the insulated material via high density plasma (HDP) 3 and second trenches 4 on the left side are filled with spin-on dielectric (SOD) 5 as examples. Due to the insulated materials in the first trench 2 and second trenches 4 are different from the material of the substrate 1, they must be etched by stages via different etching solutions or etching plasma. Referring to FIG. 1B, first etch the insulated materials in the first trench 2 and second trenches 4, with a photo mask 11 placed above the first trench 2 so that a portion of HDP 3 is retained. Referring to FIG. 1C, etch the substrate 1 to form a ditch 6. Because of the formation of the first trench 2 and second trenches 4, the substrate 1 is etched laterally and downward by the plasma. Hence a sub-trench 7 is formed on the surface of the substrate 1 near the first trench 2 and a linear horn 8 is formed on the surface of the second trench 4. As a result, the bottom surface 9 of the ditch 6 is uneven. Referring to FIG. 1D, when a metal wire 10 is formed on the bottom surface 9, the uneven bottom surface 9 also causes the metal wire 10 to form an uneven bonding surface between them.

In the process of manufacturing transistor, separation of the metal wire 10 must be performed to form a gate. Please refer to FIG. 2A for a perspective view after the aforesaid etching processes have been finished, with one set of first trench 2 and one set of second trench 4 as an example, also revealing the ditch 6. Refer to FIG. 2B for the structure with one side of the ditch 6 cut away to show a connecting condition between the metal wire 10 and bottom surface 9. FIG. 2C illustrates separation of the metal wire 10. As the bonding surface is formed at the junction of the bottom surface 9 and metal wire 10, when cutting the metal wire 10 to the bottom surface 9 is desired, a fully separated section 12 is formed while a non-separated section 13 remains because of the uneven bonding surface. Hence parts of the left side and right side of the metal wire 10 are still connected and conductive, and a etching process has to be performed until the non-separated section 13 of the metal wire 10 is fully separated to expose the sub-trench 7 and fully separate the metal wire 10 as shown in FIG. 2D. But such a process also etches the left side and right side of the metal wire 10 to become thinner, thus the metal wire 10 could drop out or being damaged. In addition, the uneven surface resulted from the sub-trench 7 also creates stacking problem among different layers during fabrication to increase the risk of current leakage.

SUMMARY OF THE INVENTION

The primary object of the present invention is to solve the problem of uneven bottom surface of ditches that causes excessive etching of a metal wire to result in dropping off or damage.

To achieve the foregoing object the invention provides a method of manufacturing vertical transistors that includes the steps as follow:

S1: Forming a substrate with a ditch. The substrate includes two opposing support portions spaced from each other at a selected distance to form the ditch. The ditch has a bottom wall and two side walls connecting to the bottom wall. Each support portion has a top wall remote from the bottom wall of the ditch;

S2: Covering a conductive layer on the bottom wall and side walls of the ditch and the top walls of the support portions via chemical vapor deposition;

S3: Removing the conductive layer on the bottom wall of the ditch and top walls of the support portions via anisotropic etching through an etch back process;

S4: Forming an oxidized portion in the ditch which contains the conductive layer;

S5: Etching a portion of the oxidized portion until reaching a selected elevation; and S6: Etching the conductive layer until reaching the selected elevation to form two gates without contacting each other.

By means of the aforesaid technique, the conductive layer is formed on the ditch coinciding with the shape of the substrate, and through the etch back process which can etch selectively, the problems of lateral etching or uneven etching rate that causes formation of sub-trench and results in increasing of etching duration and the risk of damaging the metal wire in the conventional techniques can be averted.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENT

Figure 1A:
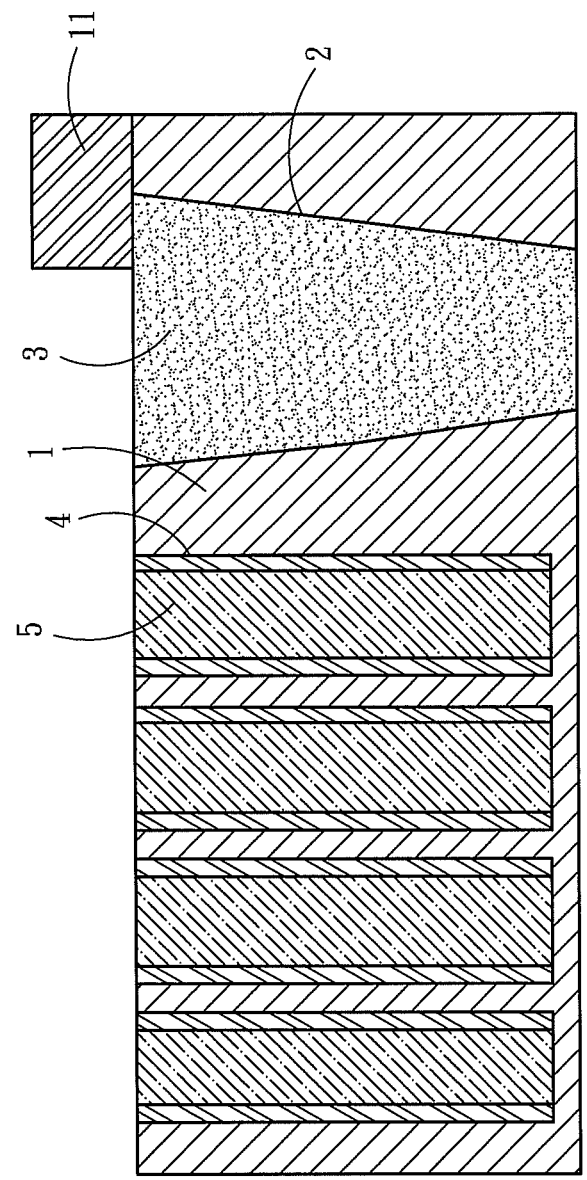
FIGS. 1A through 1D are schematic views of conventional manufacturing process for fabricating ditches.
Figure 1B:
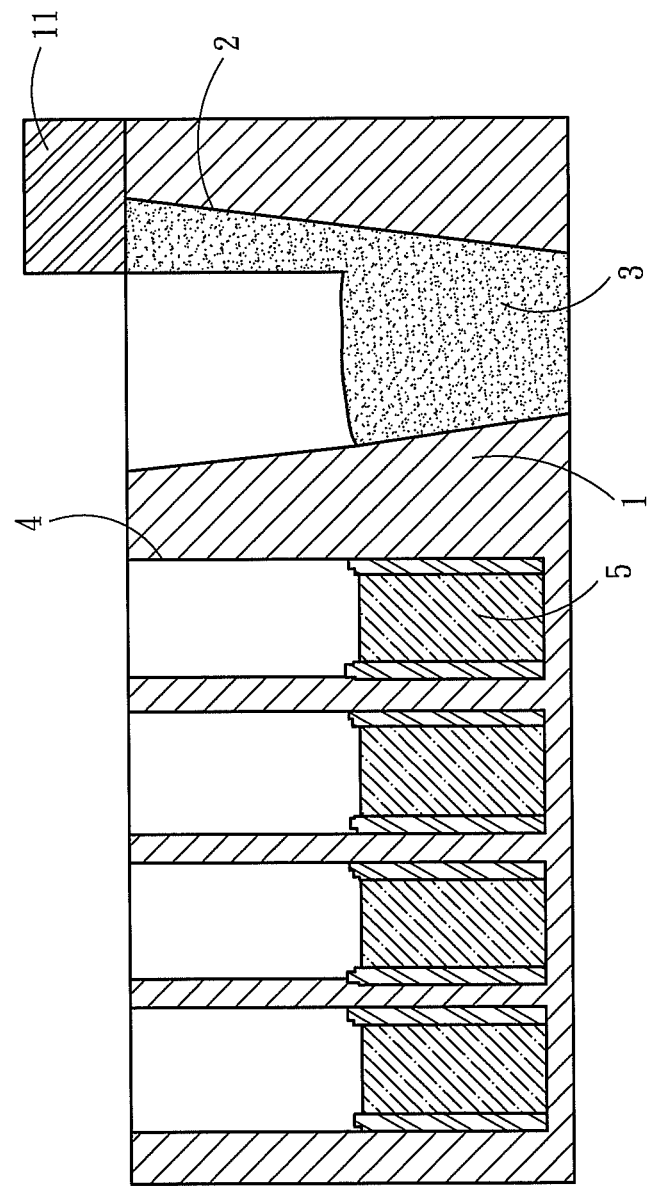
Figure 1C:
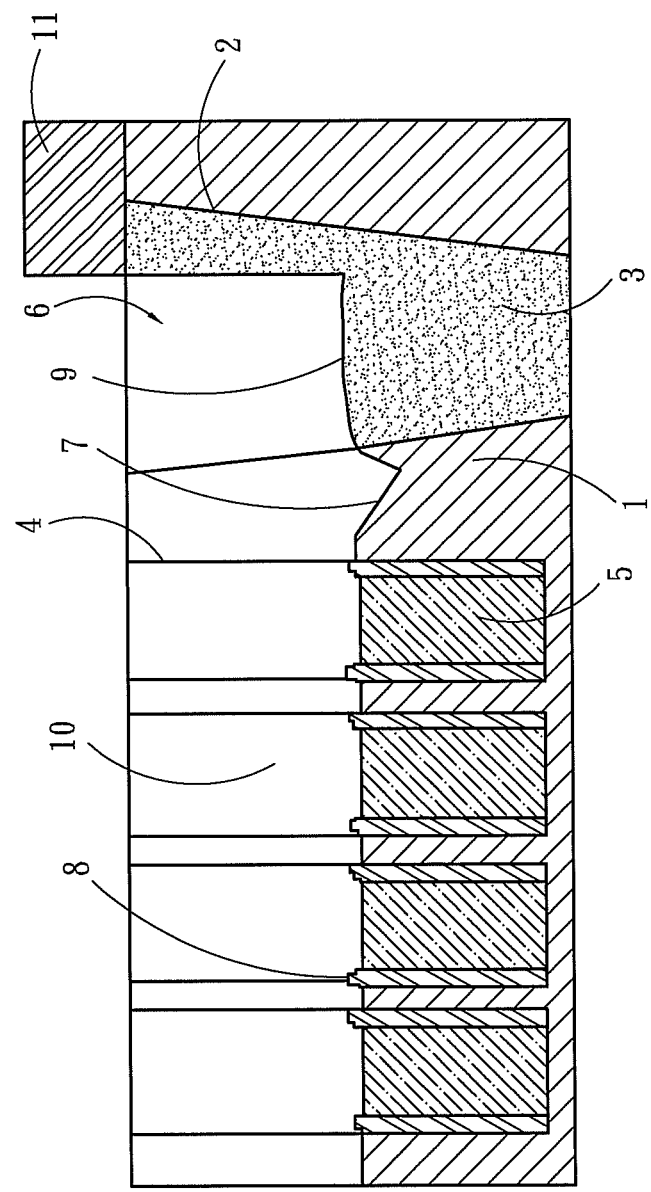
Figure 1D:
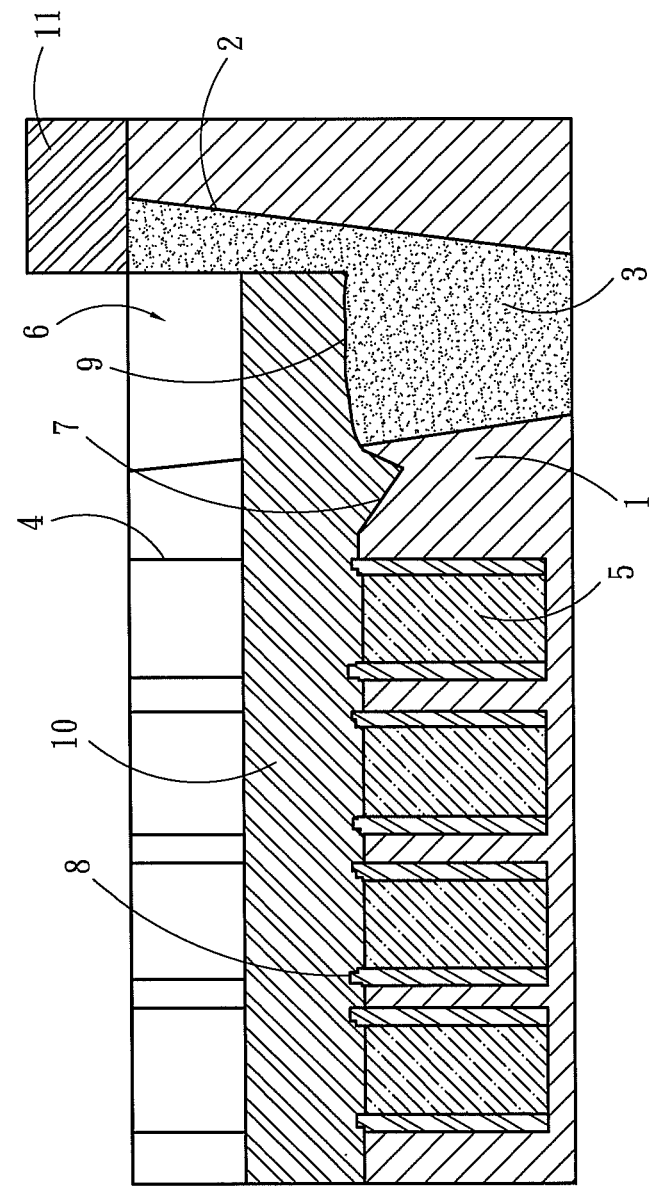
Figure 2A:
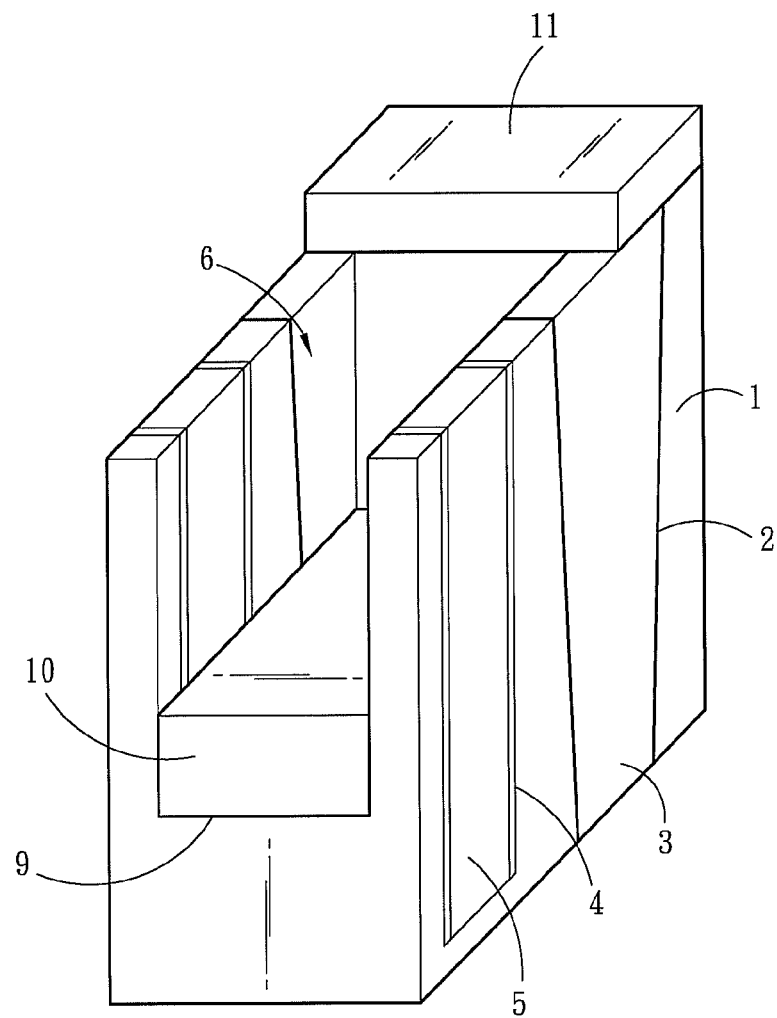
FIGS. 2A through 2D are schematic perspective views of conventional manufacturing processes.
Figure 2B:
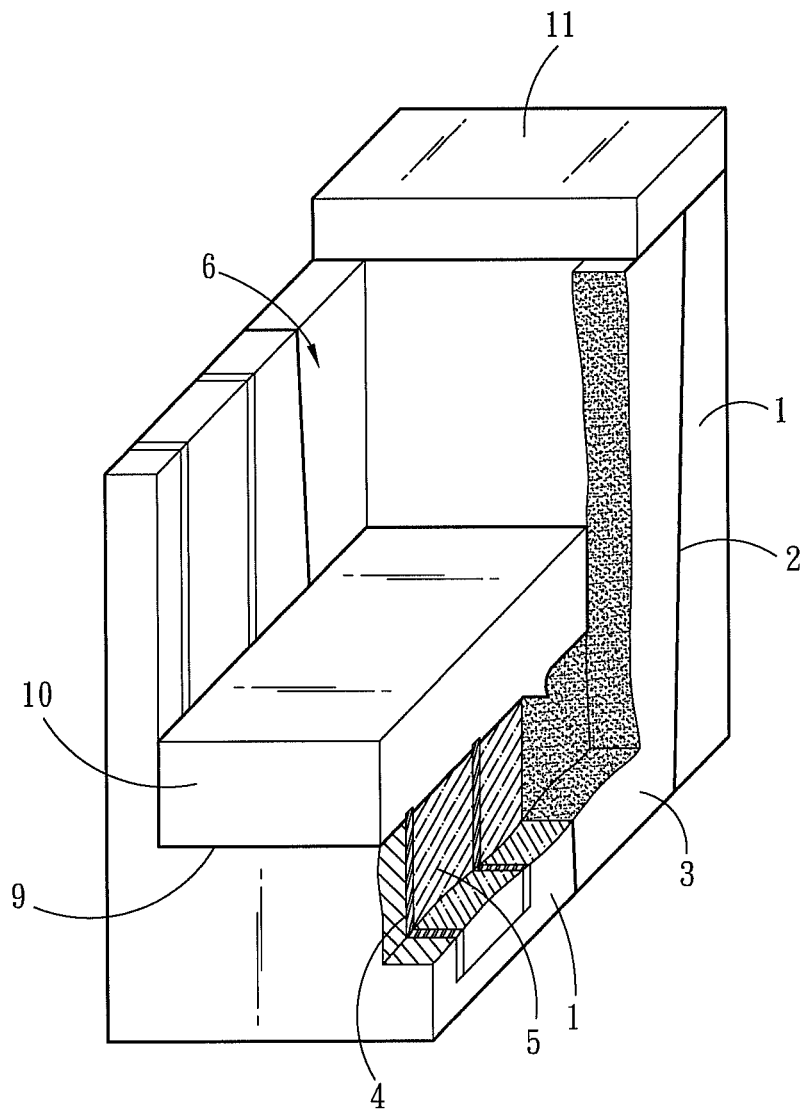
Figure 2C:
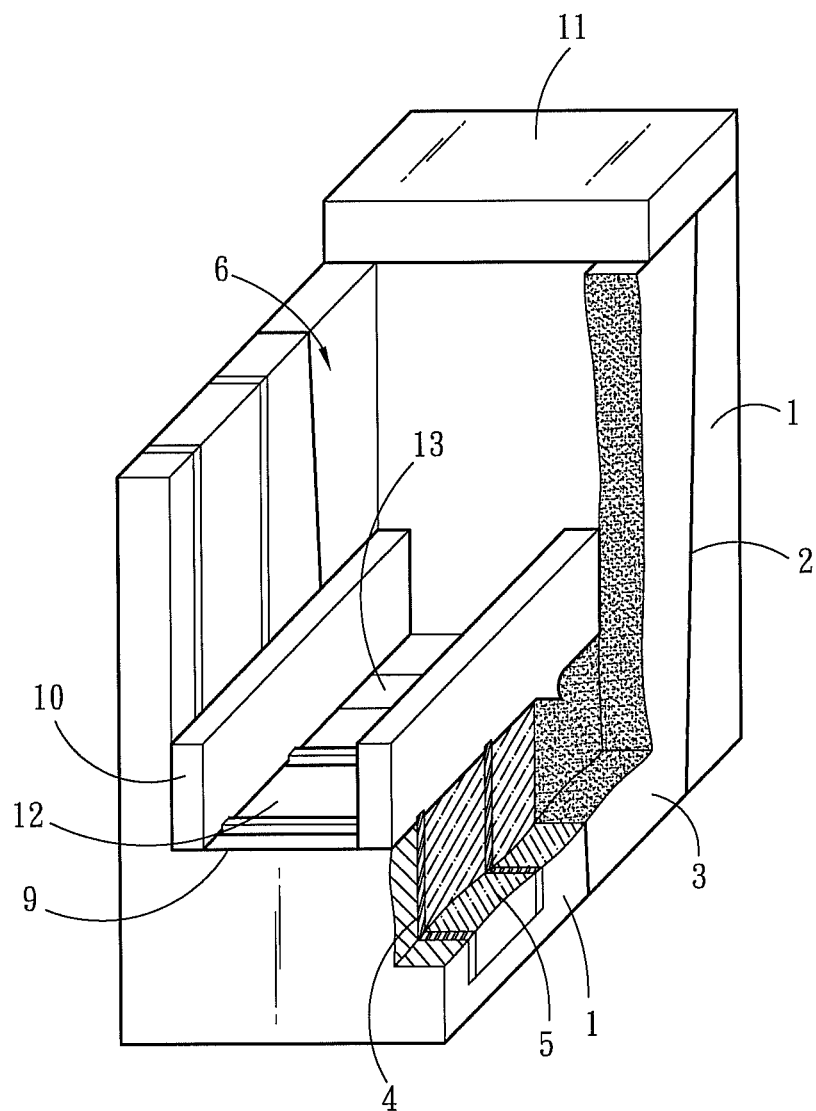
Figure 2D:
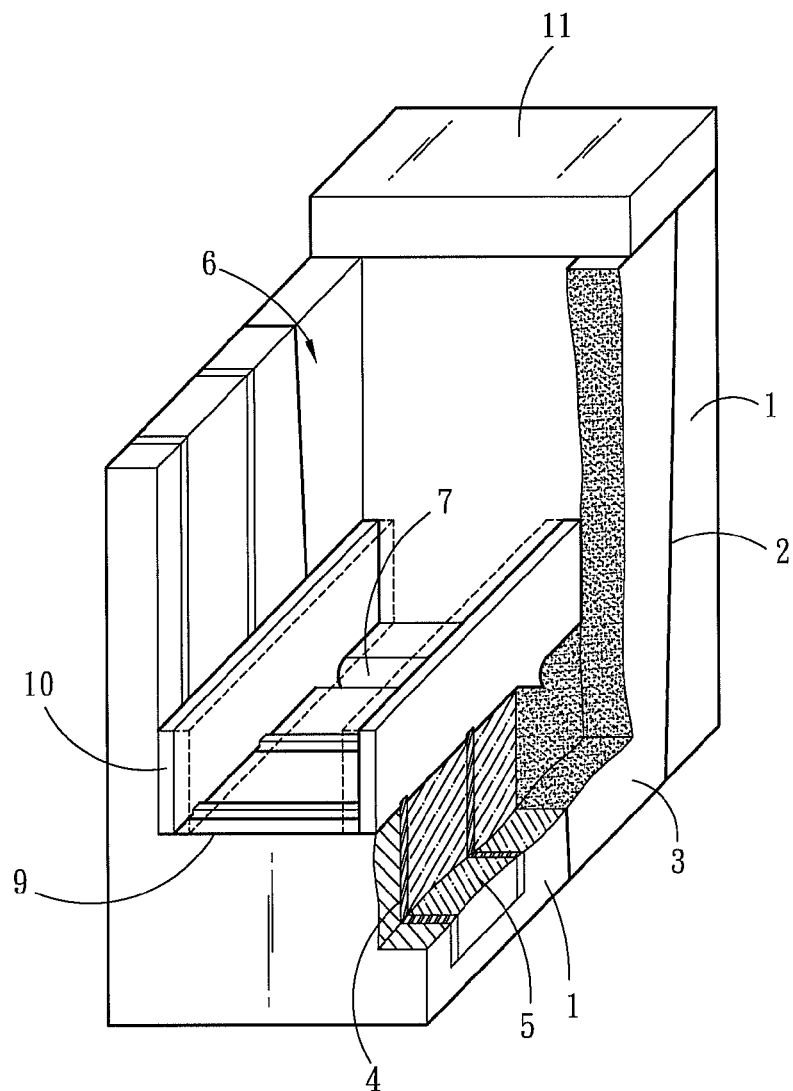
Figure 3A:
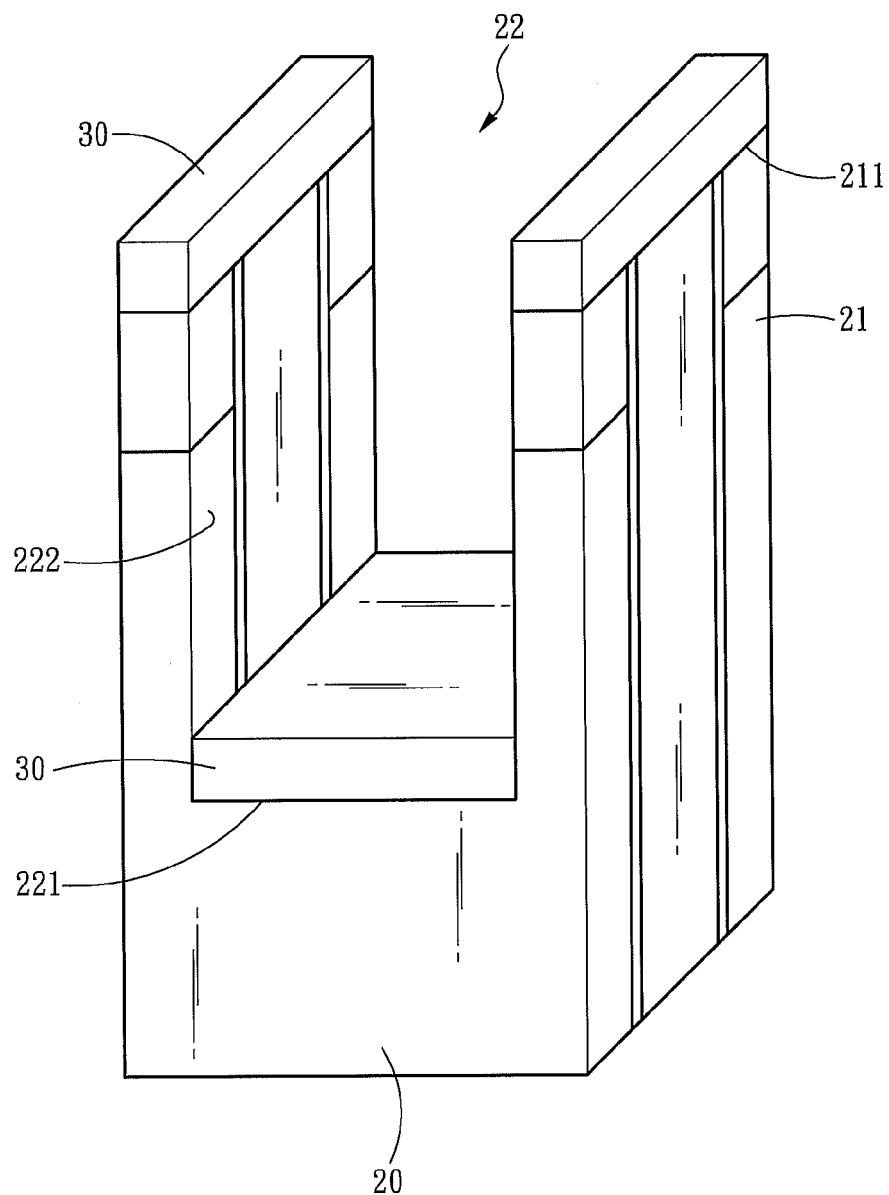
FIGS. 3A through 3G are schematic views of an embodiment of manufacturing process according to the invention.

Please refer to FIGS. 3A through 3G and FIG. 4 for an embodiment of the invention. The present invention aims to provide a method of manufacturing vertical transistors that comprises the steps as follow:

S1: Forming a substrate 20 with a ditch 22 (i.e., trench) as shown in FIG. 3A. The substrate 20 includes two opposing support portions 21 spaced from each other at a selected distance to form the ditch 22. The ditch 22 has a bottom wall 221 and two side walls 222 connecting to the bottom wall 221. In this embodiment the side walls 222 are perpendicular to the bottom wall 221. Each support portion 21 also has a top wall 211 remote from the bottom wall 221 of the ditch 22. The substrate 20 is formed via a pre-process to become an insulated structure by filling the ditch 22 vertically with material such as silica or silicon nitride. The ditch 22 is formed by etching. Due to isotropic factors of etching sub-trench or an uneven structure could be formed on the bottom. wall 221.

A1: Forming an etching stop layer 30 on the bottom wall 221 of the ditch 22 and top walls 211 of the support portions 21 to fill the uneven structure of the bottom wall 221 caused by etching. The etching stop layer 30 can be formed via HDP process to protect the bottom wall 221 and top walls 211 from being affected by the following etching processes.

Figure 3B:
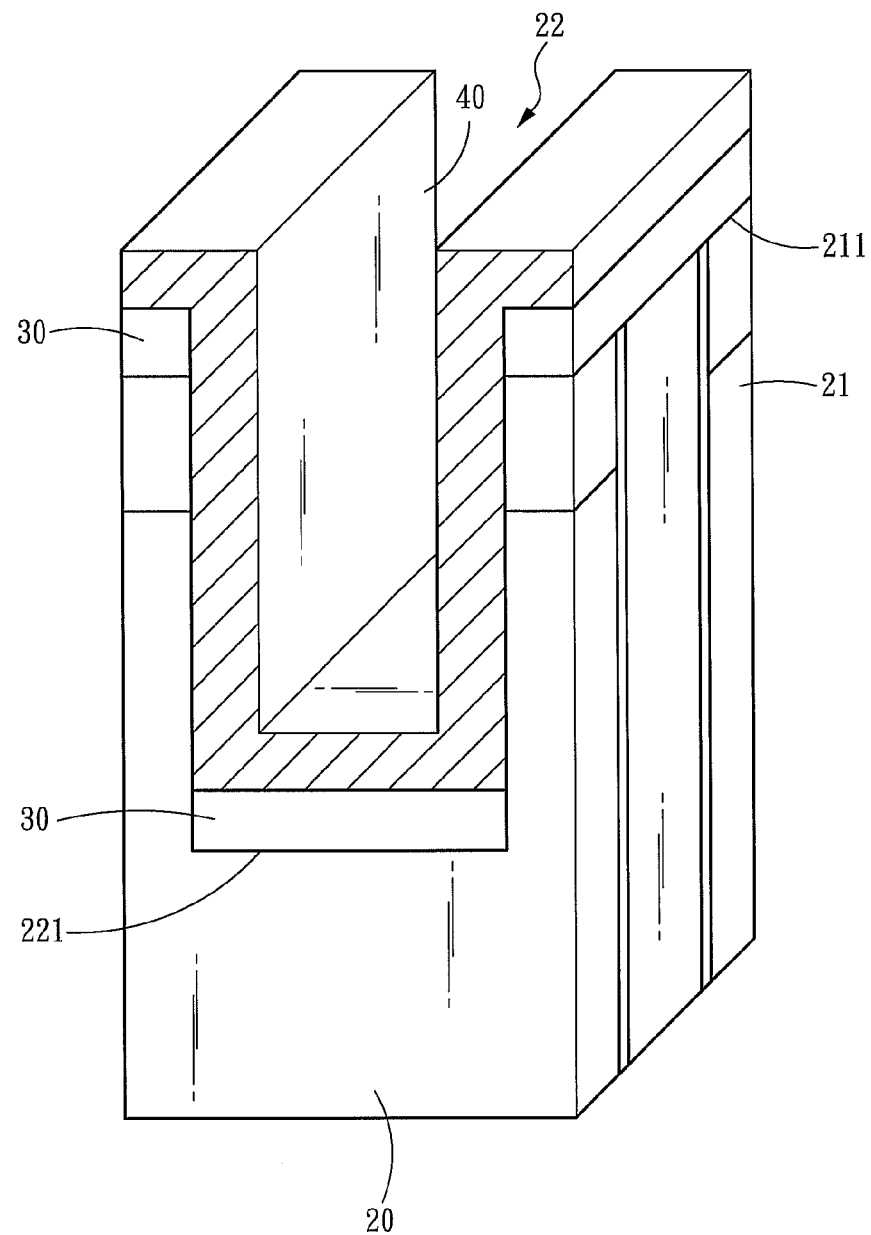
Figure 3C:
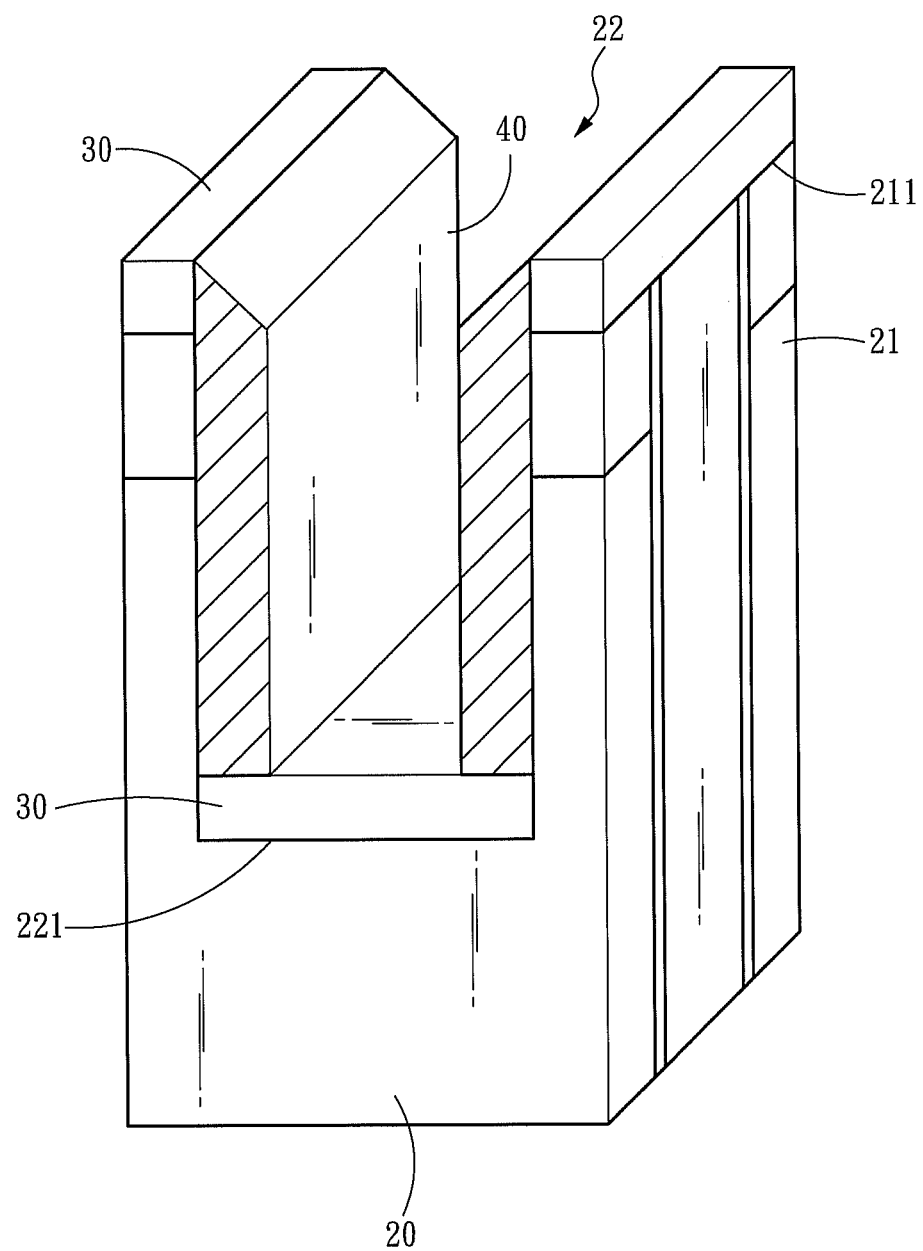

S2: Covering a conductive layer 40 on the bottom wall 221 and side walls 222 of the ditch 22 and the top walls 211 of the support portions 21 via chemical vapor deposition as shown in FIG. 3B. The conductive layer 40 can be made of metal or material with metal, such as tungsten or titanium nitride (TiN) and formed via chemical vapor deposition to mate the shape of the ditch 22 like a cap. Such a step can prevent the material waste problem of the conventional techniques that is caused by fully filling in the ditch 22 with conductive metal first but then being removed by etching. To prevent electric connection between the conductive layer 40 and substrate 20 that might result in current leakage, before the conductive layer 40 is formed a portion of the substrate 20 that is exposed can be oxidized via in situ steam generation (ISSG) technique to form an insulation medium, then the conductive layer 40 is formed. The newly formed material does not cover the surface of the substrate 20, and only the substrate 20 is oxidized, hence no special indication is shown in FIG. 3B.

S3: Removing the conductive layer 40 on the bottom wall 221 of the ditch 22 and top walls 211 of the support portions 21 via anisotropic etching through an etch back process. The etch back process is anisotropic etching to remove the conductive layer 40 mentioned above as shown in FIG. 3C. Through this step, the two conductive layers 40 on the side walls 222 are separate without connecting to form two independent conductive structures. The etching stop layer 30 protects the bottom wall 221 and top walls 211 from being damaged by the etch back process.

Figure 3D:
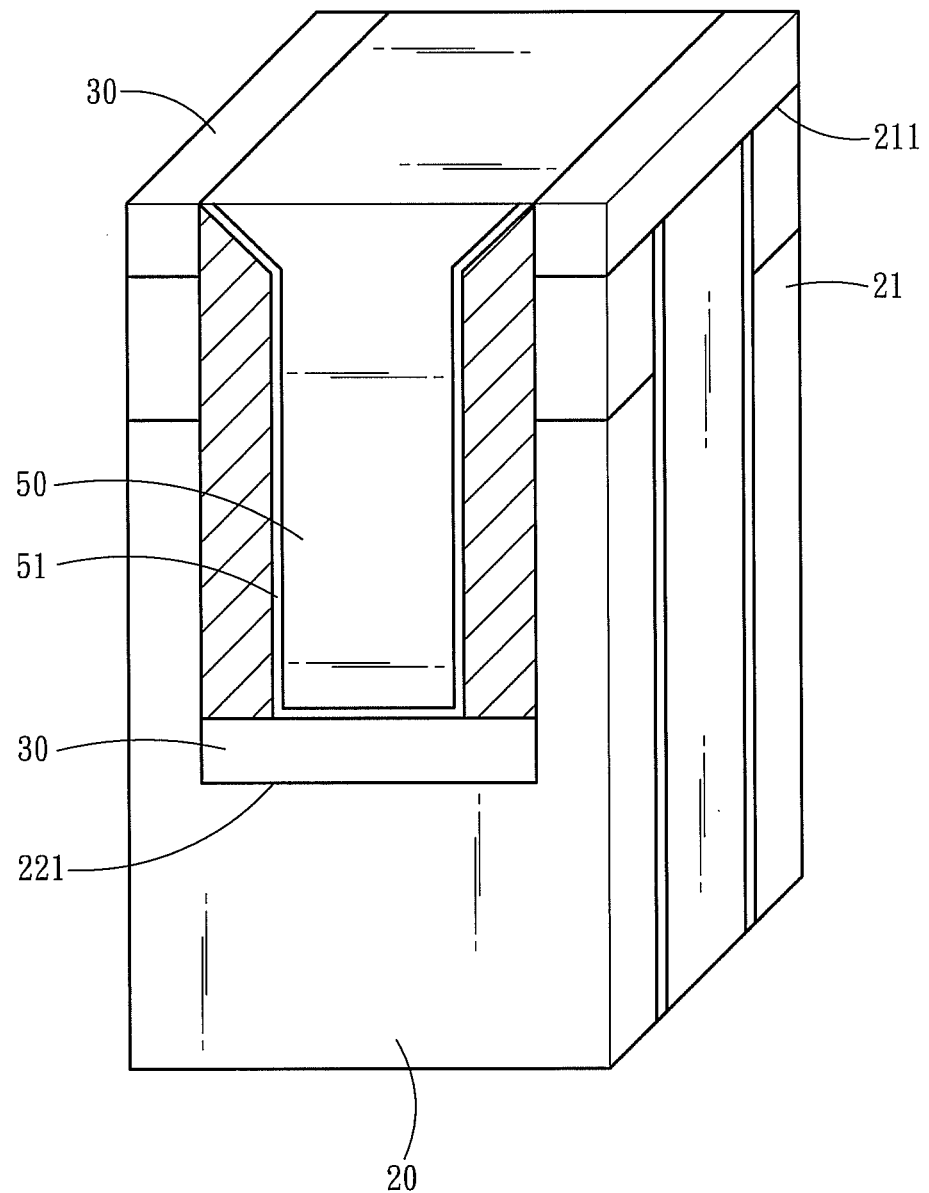

S4: Forming an oxidized portion 50 in the ditch 22 which contains the conductive layer 40 as shown in FIG. 3D, the step further includes the steps as follows:

S41: Providing a protective layer 51 on the surface of the conductive layer 40 and bottom wall 221 to prevent oxidizing the conductive layer 40 while the oxidized portion 50 is formed in the following processes. The protective layer 51 is a thin film made of silicon nitride formed on the surface of the conductive layer 40 via a linear process;

S42: Filling an oxidized material in the protective layer 51 to form the oxidized portion 50. In this embodiment, the oxidized material is made of spin-on dielectric (SOD). The SOD is fabricated by a high temperature process and tends to oxidize the surface of the conductive layer 40, hence the protective layer 51 can prevent the conductive layer 40 from in contact with exterior to be oxidized;

S43: Annealing and hardening the oxidized portion 50; and

S44: Flattening the oxidized portion 50 via chemical mechanical polishing (CMP). The top end of the oxidized portion 50 and top walls 211 of the support portions 21 are polished to reach the same level.

Figure 3E:
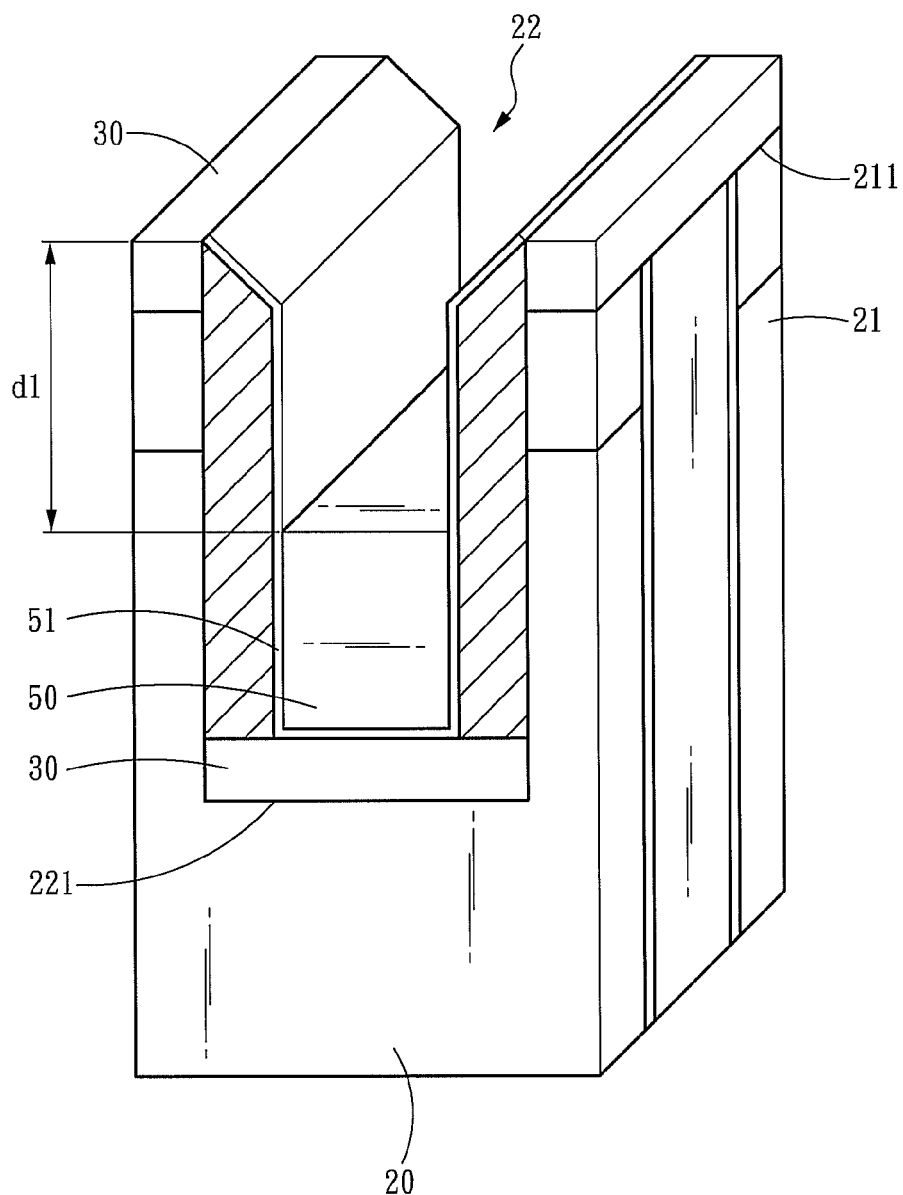

S5: Etching a portion of the oxidized portion 50 until reaching a selected elevation d1 which determines the length of the conductive layers 40 as shown in FIG. 3E.

Figure 3F:
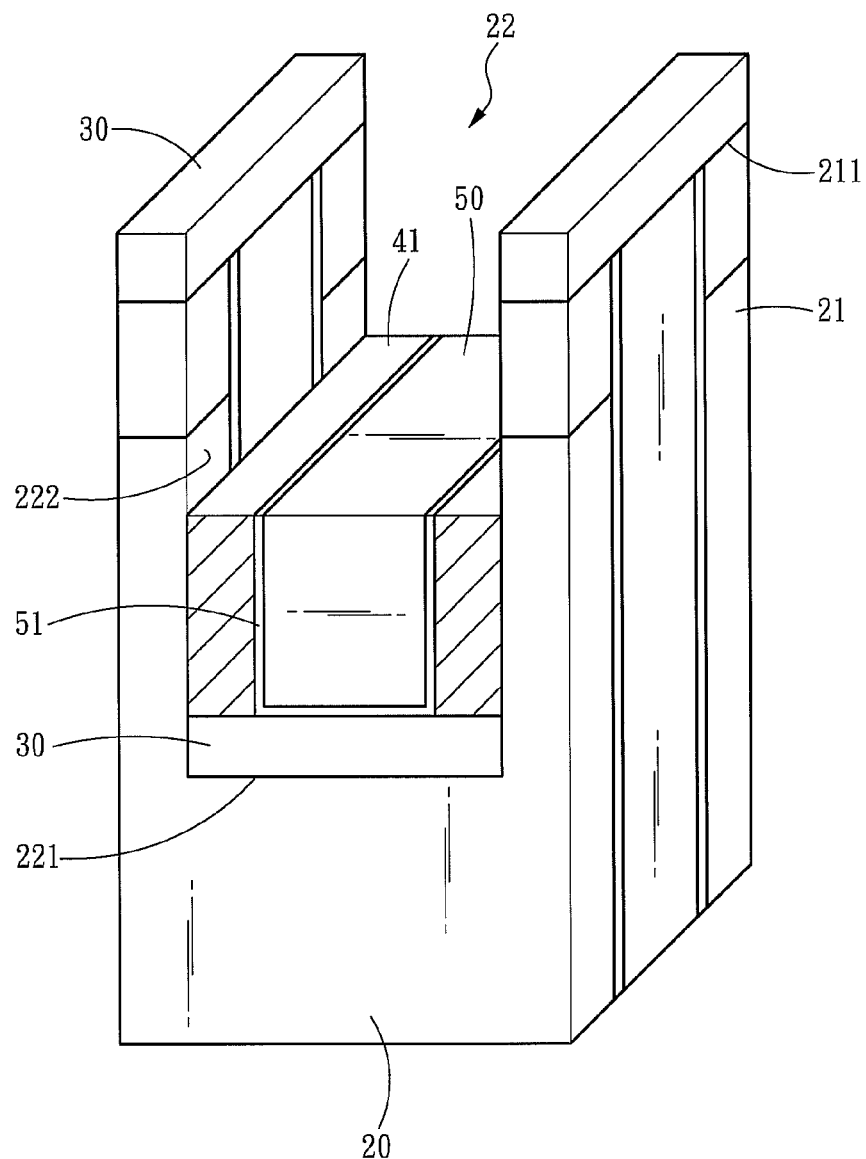

S6: Etching the conductive layer 40 not covered by the oxidized portion 50 until reaching the selected elevation d1 to form two gates 41 without contacting each other as shown in FIG. 3F.

Figure 3G:
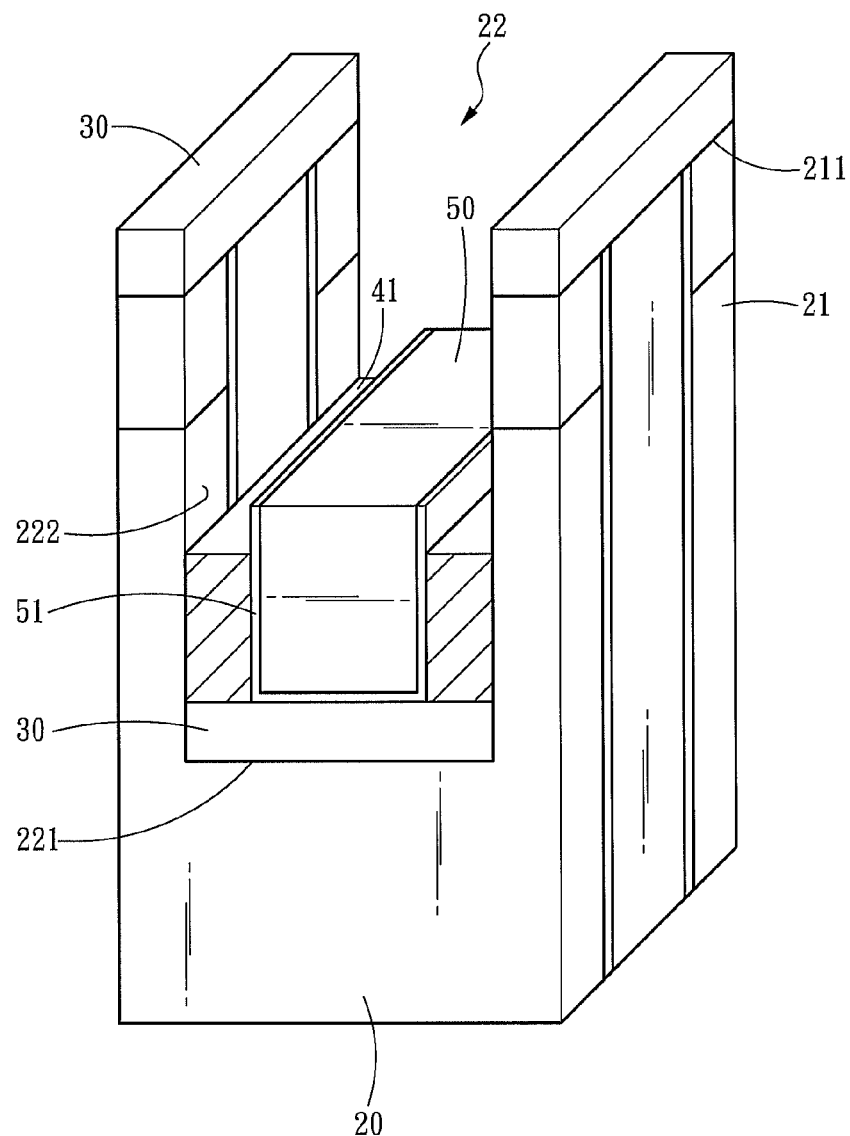
Figure 4:
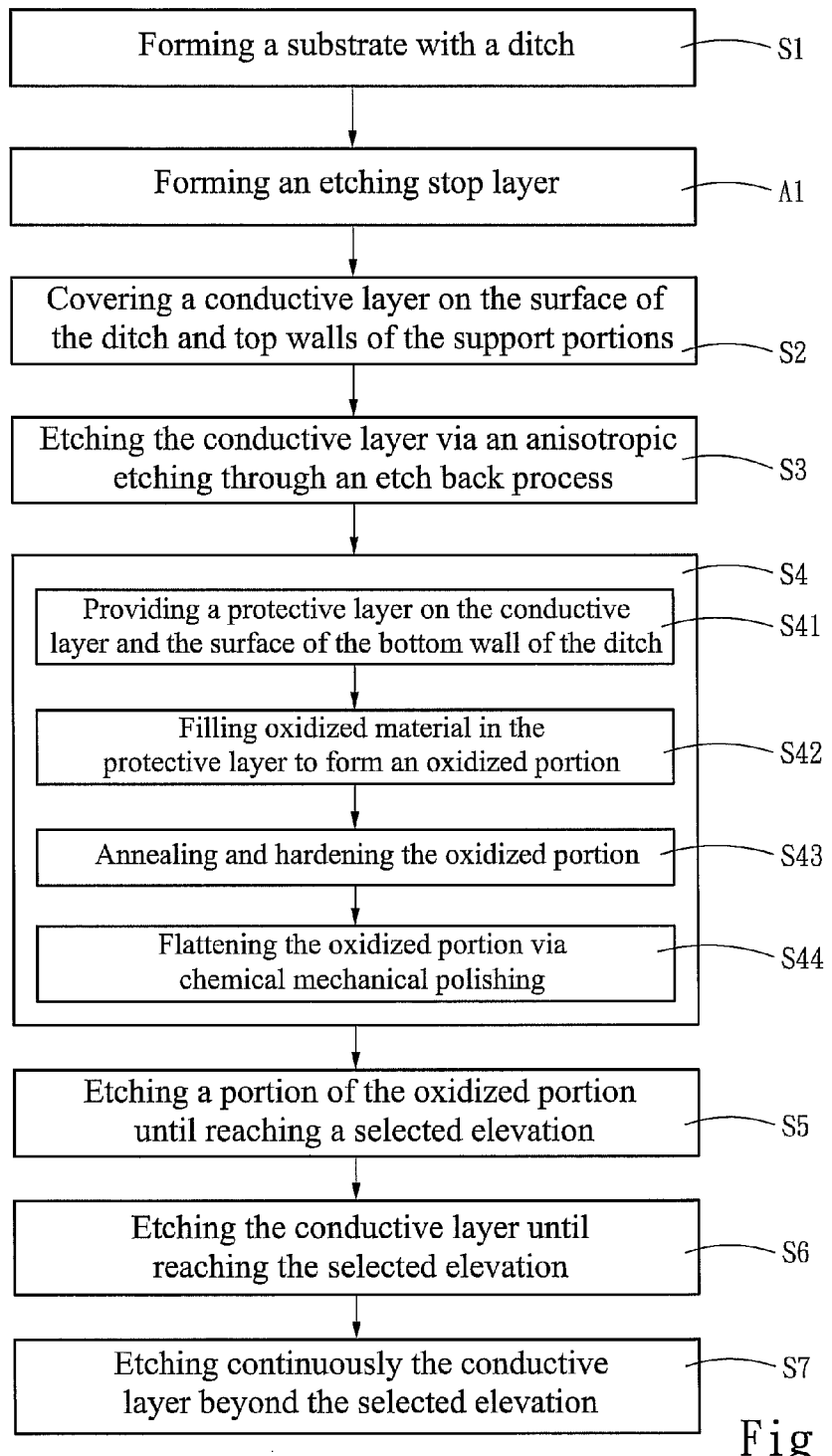
FIG. 4 is a process flowchart of an embodiment of the invention.

S7: Continuously etching the conductive layer 40 beyond the selected elevation d1 by increasing the etching duration to prevent the conductive layer 40 from remaining on the side walls 222 as shown in FIG. 3G.

By means of the method set forth above, the invention provides features as follow:

1. By covering the conductive layer 40 on the bottom wall 221 and side walls 222 of the ditch 22 and the top walls 221 of the support portions 21, the problem of wasting material caused by forming the conductive layer via filling first and then etching the conductive layer is averted.

2. Employing the etching stop layer 30 and etch back process can prevent unevenness of the bottom wall 221, and the conductive layer 40 on the bottom wall 221 can be fully removed by etching without causing short circuit problem.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention set forth in the claims.

What is claimed is:

1. A. method of manufacturing vertical transistors, comprising the steps of:
   S1: forming a substrate with two opposing support portions spaced from each other at a selected distance to form a trench which includes a bottom wall and two side walls connecting to the bottom wall, each of the support portions including a top wall remote from the bottom wall of the trench;
   S2: covering a conductive layer on the bottom wall and the side walls of the trench and the top walls of the support portions via chemical vapor deposition;
   S3: removing the conductive layer on the bottom wall of the trench and the top walls of the support portions via anisotropic etching through an etch back process;
   S4: forming an oxidized portion in the trench which includes the conductive layer;
   S5: etching a portion of the oxidized portion until reaching a selected elevation; and
   S6: etching the conductive layer until reaching the selected elevation to form in two gates without contacting each other,
   wherein the step S4 includes the steps of:
      S41: providing protective layer on surfaces of the conductive layer and the bottom wall of the trench;
      S42: filling an oxidized material in the protective layer to fOrm the oxidized portion;
      S43: annealing and hardening the oxidized portion; and
      S44: flattening the oxidized portion via chemical mechanical polishing.

2. The method of claim. 1 further including a step A1 between the step S1 and step S2 by forming an etching stop layer on the bottom wall of the trench and the top walls of the support portions.

3. The method of claim 1, wherein the conductive layer at the step S2 is made of metal or material with metal.

4. The method of claim 3, wherein the conductive layer at the step S2 is made of tungsten or titanium nitride.

5. The method of claim 1, wherein the oxidized portion at the step S42 is made of a spin-on dielectric.

6. The method of claim 1 further including a step S7 after the step S6 by etching the conductive layer continuously beyond the selected elevation to prevent the conductive layer from remaining on the side walls of the trench.

* * * * *